United States Patent
Yoshino et al.

(10) Patent No.: US 8,590,765 B2
(45) Date of Patent: Nov. 26, 2013

(54) SOLDERING APPARATUS

(75) Inventors: Shinji Yoshino, Hyogo (JP); Minoru Yamamoto, Hyogo (JP); Toshinori Mimura, Osaka (JP)

(73) Assignee: Panasonic Corporation, Osaka (JP)

( * ) Notice: Subject to any disclaimer, the term of this patent is extended or adjusted under 35 U.S.C. 154(b) by 54 days.

(21) Appl. No.: 13/201,390

(22) PCT Filed: Feb. 18, 2011

(86) PCT No.: PCT/JP2011/000896
§ 371 (c)(1),
(2), (4) Date: Aug. 12, 2011

(87) PCT Pub. No.: WO2011/105034
PCT Pub. Date: Sep. 1, 2011

(65) Prior Publication Data
US 2012/0024938 A1 Feb. 2, 2012

(30) Foreign Application Priority Data
Feb. 26, 2010 (JP) .................... 2010-041153

(51) Int. Cl.
*B23K 1/08* (2006.01)
*B23K 3/06* (2006.01)
*B23K 35/22* (2006.01)

(52) U.S. Cl.
USPC ............... 228/37; 228/33; 228/43; 228/256; 228/260

(58) Field of Classification Search
USPC .................. 228/33, 37, 43, 256, 260
See application file for complete search history.

(56) References Cited

U.S. PATENT DOCUMENTS

| | | | | |
|---|---|---|---|---|
| 6,742,693 | B2 * | 6/2004 | Wang et al. ............... | 228/37 |
| 6,851,596 | B2 * | 2/2005 | Ogawa ...................... | 228/37 |
| 7,650,851 | B2 * | 1/2010 | Tombs et al. .............. | 118/423 |
| 2006/0186183 | A1 * | 8/2006 | Morris ...................... | 228/260 |
| 2010/0163599 | A1 * | 7/2010 | Zen et al. .................. | 228/37 |
| 2010/0200644 | A1 * | 8/2010 | Tombs ...................... | 228/219 |

FOREIGN PATENT DOCUMENTS

| | | | |
|---|---|---|---|
| JP | 62-144873 | | 6/1987 |
| JP | 02-080169 | | 3/1990 |
| JP | 09-008448 | | 1/1997 |
| JP | 2757389 | | 3/1998 |
| JP | 11-054902 | | 2/1999 |
| JP | 11-284326 | | 10/1999 |
| JP | 2001-119134 | | 4/2001 |
| JP | 2002-011571 | | 1/2002 |
| JP | 2004-063677 | | 2/2004 |
| JP | 2004063677 | A * | 2/2004 |
| JP | 3628490 | | 12/2004 |
| JP | 2006-302922 | | 11/2006 |
| JP | 3145044 | | 9/2008 |

* cited by examiner

*Primary Examiner* — Devang R Patel
(74) *Attorney, Agent, or Firm* — Hamre, Schumann, Mueller & Larson, P.C.

(57) ABSTRACT

A solder drawing member (402) is detachably attached on the outer side of a jet nozzle (303) that jets molten solder pumped from a solder tank (102) storing the molten solder. The solder drawing member (402) is made of a material having higher wettability to the molten solder than the surface material of the jet nozzle (303). Thus a force of separating the solder from a point to be soldered can be increased by a surface tension of the molten solder flowing on the solder drawing member (402), thereby reducing bridge phenomena and icicle phenomena.

11 Claims, 11 Drawing Sheets

FIG. 4
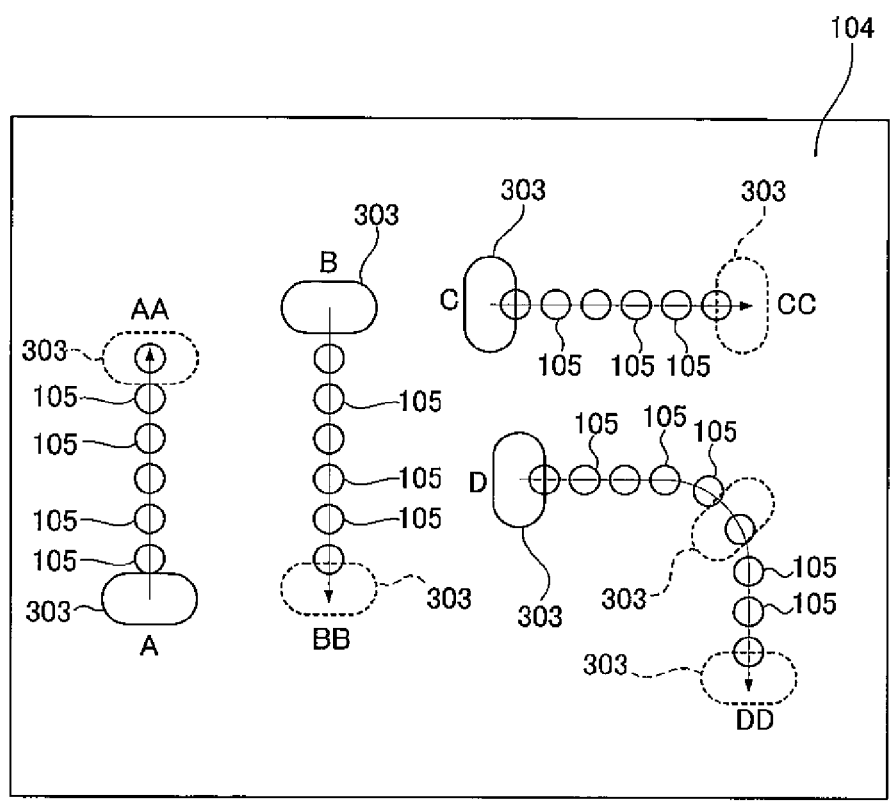
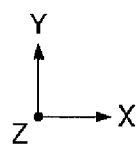

F I G. 7
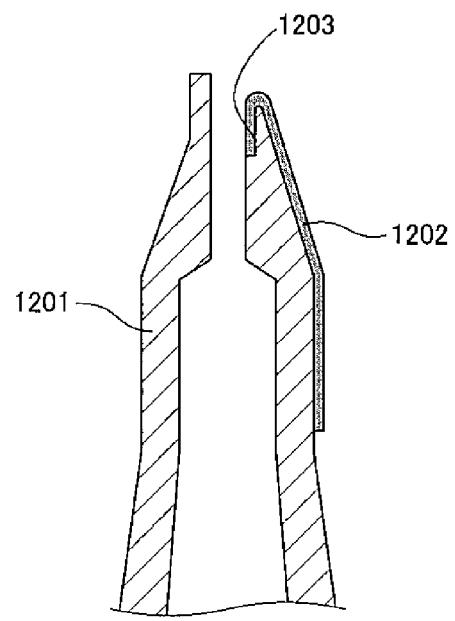
F I G. 8
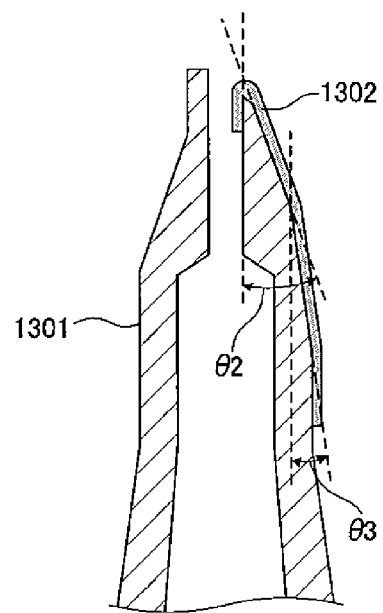

FIG. 10
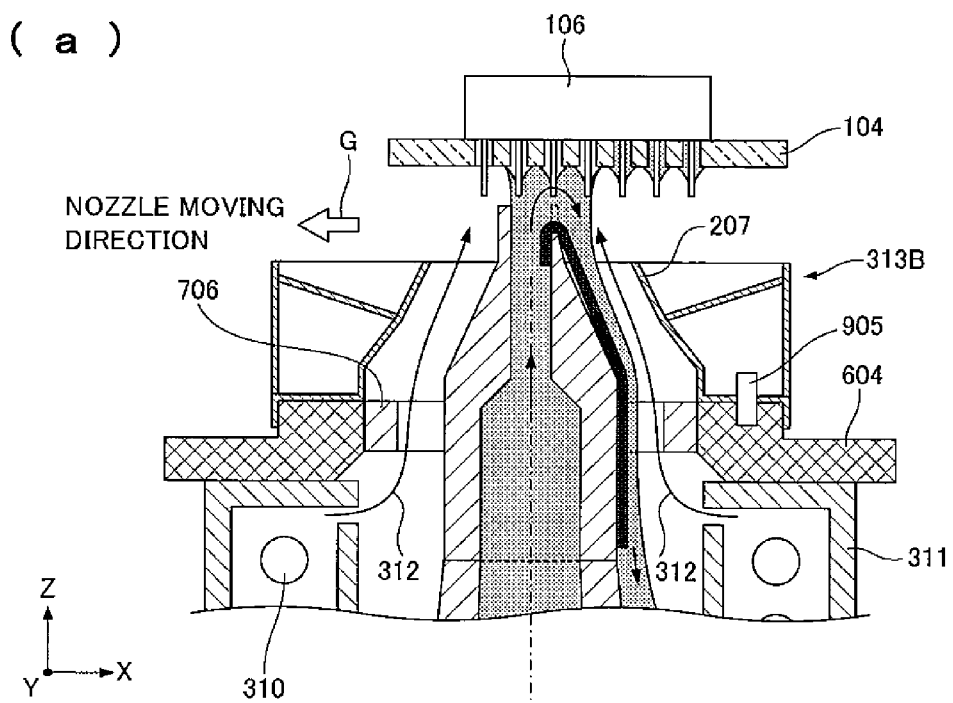
(a)
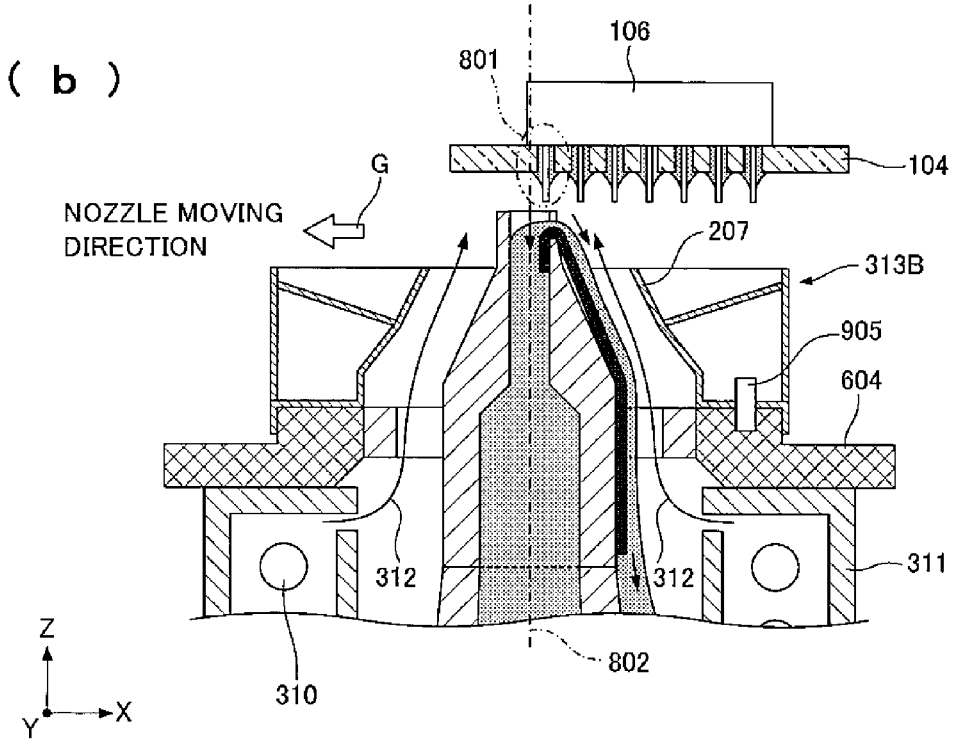
(b)

F I G. 1 2  PRIOR ART
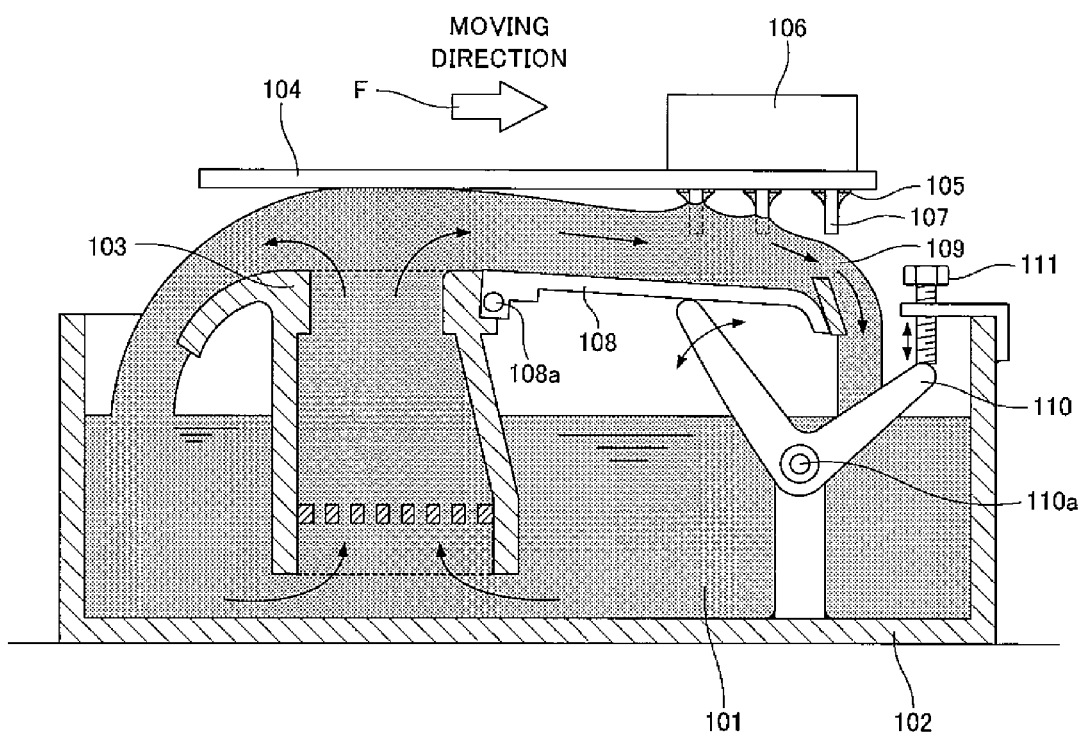

SOLDERING APPARATUS

TECHNICAL FIELD

The present invention relates to a jet soldering apparatus that applies a jet of molten solder to, for example, a printed wiring board.

RELATED ART

In some soldering methods, the leads of an electronic component are soldered to the lands of a printed wiring board with the leads inserted into the printed wiring board. In such soldering methods, a flow soldering technique is used that applies a jet of molten solder to a target location.

Patent Literature 1 and Patent Literature 2 describe this kind of known soldering apparatuses. The soldering apparatus of Patent Literature 1 reduces the occurrence of bridge phenomena and icicle phenomena by adjusting the angle and flow rate of applied molten solder that freely falls to separate from a soldered point. The bridge phenomenon is a state in which leads are electrically connected by soldering. The icicle phenomenon is a state in which solder hanging from leads solidifies.

FIG. 12 shows the soldering apparatus of Patent Literature 1.

Molten solder 101 is heated to a predetermined temperature in a solder tank 102 and is stored therein in a molten state. The molten solder 101 is fed to a nozzle body 103 through a pumping apparatus and a duct.

The molten solder 101 jetted from the nozzle body 103 comes into contact with lands 105 of a printed wiring board 104 and leads 107 of an electronic component 106 to solder the lands 105 and the leads 107. At this point, the printed wiring board 104 is transported in a moving direction indicated by arrow F. The entire surface of the printed wiring board 104 is soldered by moving the printed wiring board 104 relative to the molten solder.

At this point, an excessive volume of the molten solder 101 in soldering passes through a rear straightening vane 108 and returns as falling molten solder 109 to the solder tank 102. The rear straightening vane 108 has a proximal end pivotally supported by a shaft 108a. An adjustment screw 111 is adjusted to pivot about a shaft 110a, so that the end of the rear straightening vane 108 is moved up or down. In Patent Literature 1, the inclination of the rear straightening vane 108 is adjusted by the adjustment screw 111 such that a relative velocity is zero between the flow velocity of the falling molten solder 109 and the transport velocity of the printed wiring board 104, thereby reducing bridge phenomena and icicle phenomena.

In the soldering apparatus of Patent Literature 2, molten solder applied to a printed wiring board 104 is forcibly sucked to reduce bridge phenomena and icicle phenomena.

FIG. 13 shows the soldering apparatus of Patent Literature 2.

Molten solder 101 pumped by a pump 201 is blown up to the printed wiring board 104 by a nozzle body 203. In the nozzle body 203, the molten solder 101 is split by a venturi forming plate 202 into a flow that passes through the top surface of the venturi forming plate 202 and then is guided by a rear flow guide plate 206 to a venturi part 205 and a flow that passes through the underside of the venturi forming plate 202 to the venturi part 205. An excessive volume of the molten solder 101 on leads 107 of the printed wiring board 104 freely falls due to its own weight and is sucked with molten solder 109 falling from a venturi passage 204, so that the molten solder 101 can flow at a higher flow velocity. Thus in Patent Literature 2, a force of sucking an excessive volume of the molten solder 101 from the leads 107 is increased to reduce bridge phenomena and icicle phenomena.

CITATION LIST

Patent Literature

Patent Literature 1: Japanese Patent No. 2757389
Patent Literature 2: Japanese Patent No. 3628490

SUMMARY OF INVENTION

Technical Problem

In the configuration of Patent Literature 1, unfortunately, excessive solder on the leads 107 cannot be removed. In the configuration of Patent Literature 2, the venturi forming plate 202 is necessary in the nozzle body 203, resulting in a complicated nozzle structure.

An object of the present invention is to provide a soldering apparatus which can reduce bridge phenomena and icicle phenomena with a simple configuration.

Solution to Problem

A soldering apparatus of the present invention includes: a solder tank storing molten solder; a jet nozzle that jets the molten solder supplied from the inside of the solder tank; and a solder drawing member attached to the opening of the jet nozzle, wherein the solder drawing member has a surface made of a material having higher wettability than the surface of the jet nozzle.

Advantageous Effects of Invention

According to the present invention, it is possible to increase a force of separating solder from a point to be soldered, thereby reducing bridge phenomena and icicle phenomena.

BRIEF DESCRIPTION OF DRAWINGS

FIG. 4 shows soldering tracks according to the first embodiment.

FIG. 7 is an enlarged view showing the end of the jet nozzle of a soldering apparatus according to a fourth embodiment of the present invention.

FIG. 8 is an enlarged view showing the end of the jet nozzle of a soldering apparatus according to a fifth embodiment of the present invention.

FIG. 10(*a*) is a first explanatory drawing showing an operation example of the soldering apparatus according to the sixth embodiment. FIG. 10(*b*) is a second explanatory drawing showing an operation example of the soldering apparatus according to the sixth embodiment.

FIG. 12 shows a soldering apparatus described in Patent Literature 1.

DESCRIPTION OF EMBODIMENTS

Figure 1:
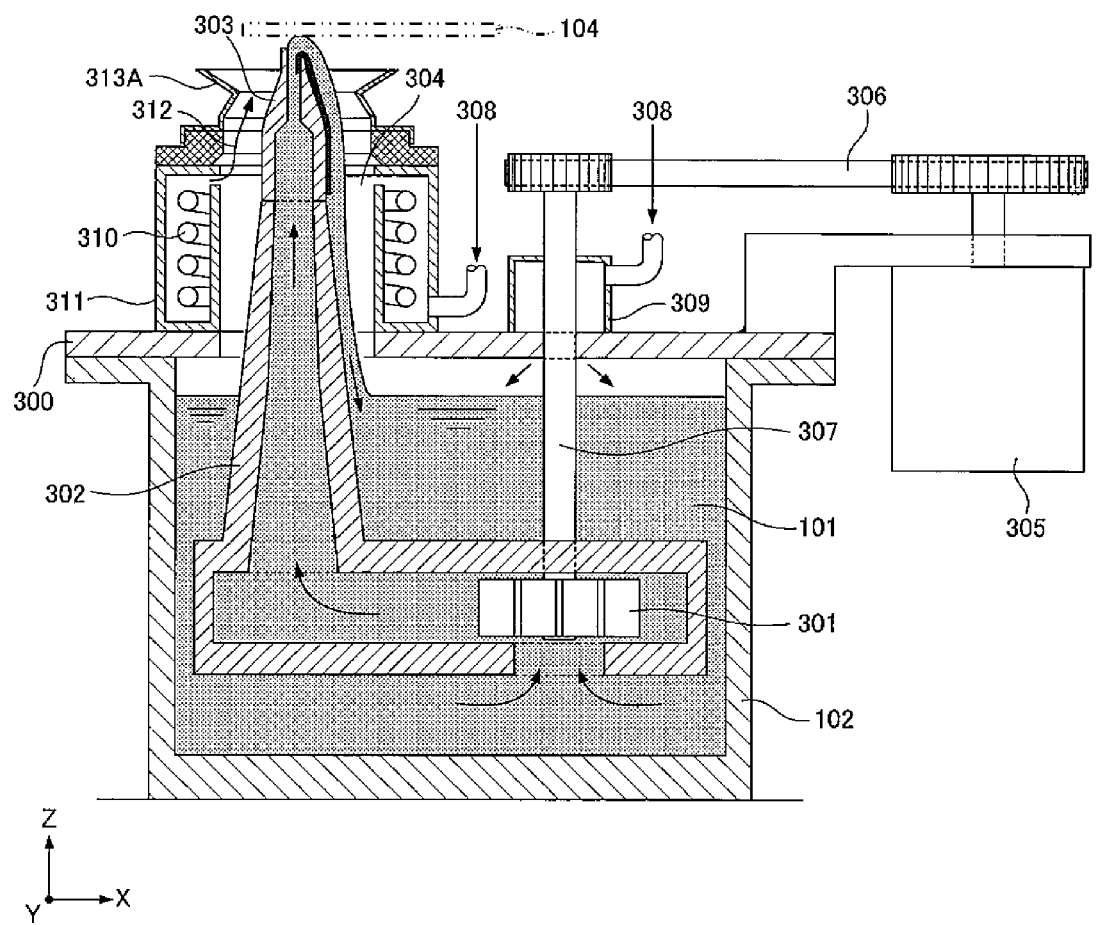
FIG. 1 is a cross-sectional view showing a soldering apparatus according to a first embodiment of the present invention.

The following will describe embodiments of the present invention in accordance with the accompanying drawings. In the following explanation, the same configurations are indicated by the same reference numerals and the explanation thereof may be omitted.

(First Embodiment)

Figure 2:
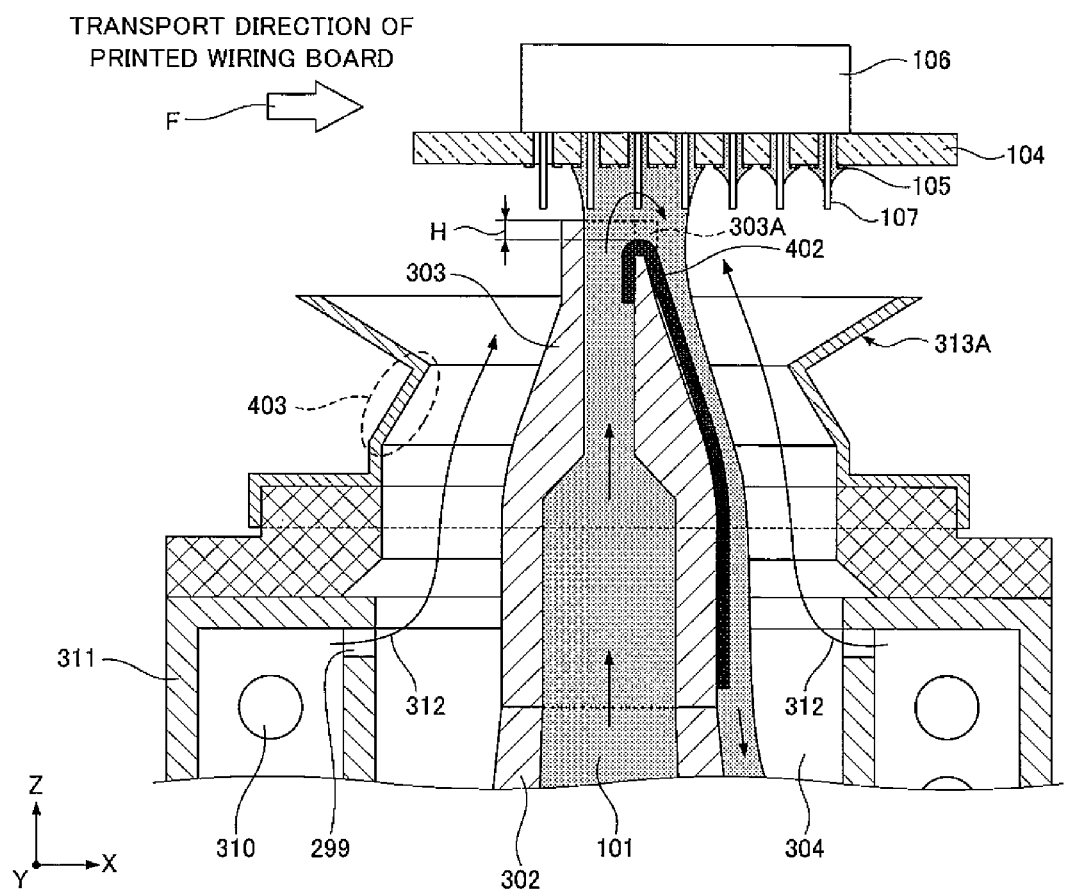
FIG. 2 is a detail view showing a part around a jet nozzle according to the first embodiment.
Figure 3:
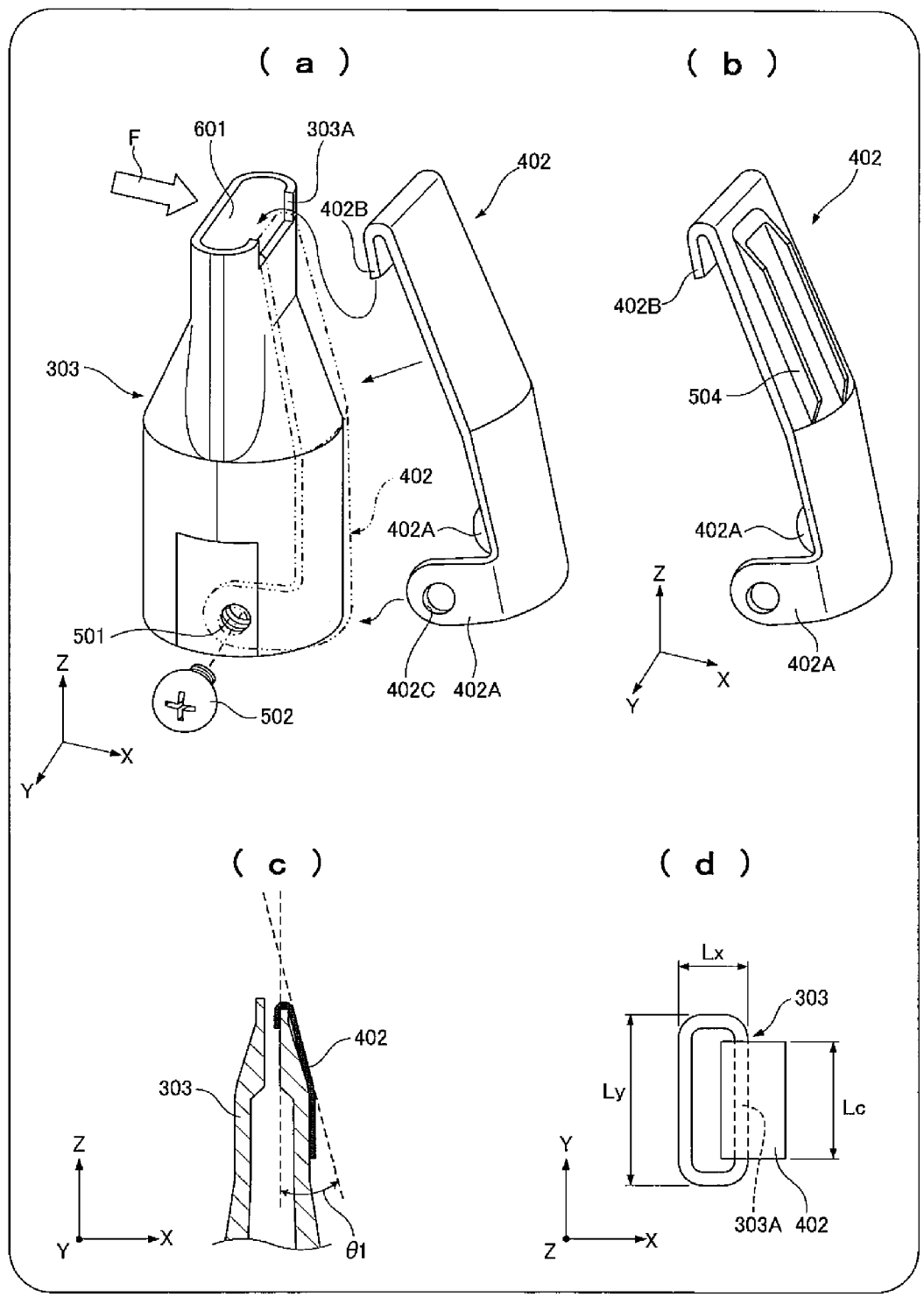
FIG. 3(a) is an exploded perspective view showing the jet nozzle according to the first embodiment.
FIG. 3(b) is an exploded perspective view showing a solder drawing member according to the first embodiment.
FIG. 3(c) is an enlarged view showing the end of the jet nozzle according to the first embodiment.
FIG. 3(d) is a plan view showing the jet nozzle of the soldering apparatus according to the first embodiment.

Referring to FIGS. 1 to 3, a soldering apparatus will be described according to a first embodiment of the present invention. In these drawings, X, Y, and Z axes are illustrated to clarify the correspondence of the drawings.

In FIG. 1, molten solder 101 stored in a solder tank 102 is compressed by a propeller driving motor 305 and a propeller 301, which constitute a pumping apparatus, and passes through a supply duct 302. The molten solder 101 is then fed to a jet nozzle 303 attached to the end of the supply duct 302. After that, the molten solder 101 is jetted from the opening of the jet nozzle 303. The molten solder 101 jetted from the jet nozzle 303 is applied to points to be soldered on a printed wiring board 104 and an excessive volume of the molten solder 101 returns to the solder tank 102.

A rotation of the propeller driving motor 305 is transmitted through a chain 306 and a shaft 307 to rotate the propeller 301. The shaft 307 has a supply port 309 for feeding inert gas 308. The inert gas 308 supplied to the supply port 309 is fed to the top surface of the molten solder 101 along the shaft 307 to cool the shaft 307. The inert gas 308 supplied to the top surface of the molten solder 101 prevents deterioration of a bearing (not shown) rotationally supporting the shaft 307 and suppresses the occurrence of oxides on the top surface of the molten solder 101. Gas having a purity of less than 99.9% cannot effectively suppress the occurrence of oxides. Thus the inert gas 308 of the first embodiment is nitrogen gas ($N_2$) having a purity of at least 99.9%.

An opening on the top of the solder tank 102 is covered with a lid 300 except for the projecting portion of the supply duct 302. The projecting portion of the supply duct 302 from the solder tank 102 is surrounded by a heating unit 311 with a passage 304 interposed between the projecting portion and the heating unit 311. The heating unit 311 includes a heater 310. The inert gas 308 supplied from the outside to the lower part of the heating unit 311 is heated by the heater 310 and is discharged as heated inert gas 312 to the vicinity of the jet nozzle 303 from an opening 299 formed inside the upper part of the heating unit 311. As shown in FIG. 2, the inert gas 312 is discharged to the printed wiring board 104 while being guided by a hood 313A surrounding the jet nozzle 303, so that the inert gas 312 prevents oxidation of the molten solder 101 jetted from the jet nozzle 303.

In flow soldering, it is quite important to keep a soldering temperature and suppress the occurrence of oxides. Thus the inert gas is supplied after being heated by the heating unit 311, achieving the function of suppressing a temperature decrease of the jet nozzle 303 and mixing of oxides into the molten solder 101. Specifically, in the first embodiment, the inert gas 312 under the heating temperature of the solder tank 102 cannot prevent a temperature decrease and thus the inert gas 312 is set to at least the heating temperature of the solder tank 102.

As shown in FIG. 2, in the soldering apparatus of the first embodiment, the molten solder 101 jetted from the jet nozzle 303 is applied to lands 105 of the printed wiring board 104 and leads 107 of an electronic component 106. At this point, the printed wiring board 104 is transported along arrow F (the transport direction of the printed wiring board) relative to the jet nozzle 303 during the soldering.

As shown in FIG. 3(*a*), an opening 601 of the jet nozzle 303 has a notch 303A. The notch 303A is located downstream in the transport direction of the printed wiring board 104. In other words, in the case where the printed wiring board 104 is transported such that the jet nozzle 303 moves relative to the printed wiring board 104, the notch 303A is formed at the rear of the jet nozzle 303 in the moving direction of the jet nozzle 303.

The notch 303A of the jet nozzle 303 has a detachable solder drawing member 402. The solder drawing member 402 is made of a material having higher wettability to molten solder than the surface material of the jet nozzle 303. In this case, high wettability to molten solder means that the molten solder is wettable and extendable. Thus in the structure of the first embodiment shown in FIG. 3(*a*), the molten solder is more likely to flow into the solder drawing member 402 than into the jet nozzle 303. Consequently, the molten solder is attracted to the solder drawing member 402. In the case where the jet nozzle 303 is made of stainless steel (e.g., SUS 316), a specific example of the material of the solder drawing member 402 may be pure iron containing at least 99% of iron components. The solder drawing member 402 composed of, for example, pure iron containing at least 99% of iron components may be also used in the case where the jet nozzle 303 is made of titanium or the stainless-steel surface is nitrided.

In the structure of the first embodiment, the solder drawing member 402 attracts the molten solder rather than the jet nozzle 303. Thus by replacing only the solder drawing member 402, the endurance time of the jet nozzle 303 can be increased.

FIG. 3(*c*) is an enlarged view showing the end of the jet nozzle according to the first embodiment. As shown in FIG. 3(*c*), in the first embodiment, the solder drawing member 402 has an inclination angle θ1 of 15° with respect to the flowing direction of the molten solder, that is, the vertical direction. At the inclination angle θ1, the molten solder easily flows on the solder drawing member 402 and hardly overflows the solder drawing member 402. Considering the flowability of the molten solder with the inclined solder drawing member 402, the inclination angle θ1 is desirably set at 15° or larger. It is considered that flowability is obtained when the inclination angle θ1 is larger than 0°. In the configuration of a typical soldering apparatus, when the inclination angle θ1 is larger than 30°, the cross-sectional area of the jet nozzle 303 increases, so that the soldering apparatus may be increased in size. Thus in the first embodiment, the inclination angle θ1 is set at 0°<θ1≤30° (more desirably at 15°≤θ1≤30°).

The lower part of the solder drawing member 402 has an arm 402A that holds the jet nozzle 303 from both sides. The upper part of the solder drawing member 402 has a bent portion 402B that is engaged with the notch 303A of the jet nozzle 303. As indicated by virtual lines in FIG. 3(*a*), the solder drawing member 402 is attached by engaging the bent portion 402B with the notch 303A of the jet nozzle 303 and securing a hole 402C, which is formed on the arm 402A of the solder drawing member 402, onto a tapped hole 501 of the jet nozzle 303 with a bolt 502. Since the bent portion 402B is engaged with the notch 303A of the jet nozzle 303, the solder drawing member 402 can be easily replaced and the performance can be maintained after the replacement.

FIGS. 3(*a*) and 3(*b*) show examples for facilitating replacement. The solder drawing member may have a different configuration from those of FIGS. 3(*a*) and 3(*b*) as long as the object of the present invention is attained. For example, in the first embodiment, the bent portion 402B is engaged with the notch 303A of the jet nozzle 303, thereby duplicating the location of the attached solder drawing member 402. The solder drawing member 402 may be screwed after being aligned with a reference position provided at a part of the jet nozzle 303.

The jet nozzle 303 is attached so as to direct the notch 303A to the downstream side of the transport direction F of the printed wiring board 104. As shown in FIG. 2, the molten solder 101 jetted from the jet nozzle 303 comes into contact with the back side of the printed wiring board 104 and is used for soldering. An excessive volume of the molten solder 101 substantially flows on the solder drawing member 402 from a gap between the jet nozzle 303 and the solder drawing member 402 and returns to the solder tank 102.

The effect of the solder drawing member 402 will be specifically described below.

A downward force of gravity is applied to the molten solder 101 that comes into contact with the back side of the printed wiring board 104 and returns to the solder tank 102. In the case where an object to be soldered has a large surface area, the leads 107 and the lands 105 have large thermal capacities, so that the molten solder 101 hardly falls. Thus an object to be soldered with a large surface area is likely to cause a bridge phenomenon or an icicle phenomenon.

In the first embodiment, the notch 303A downstream of the transport direction F of the jet nozzle 303 includes the solder drawing member 402. The prepared solder drawing member 402 is made of a material having higher wettability to molten solder than the surface material of the jet nozzle 303, and the solder drawing member 402 is provided at the notch 303A. Thus as shown in FIG. 2, the molten solder 101 flowing downward on the solder drawing member 402 having high wettability receives a surface tension from the solder drawing member 402 as well as gravity, so that an excessive volume of the molten solder 101 from the leads 107 and the lands 105 can be forcibly fed downward and removed with a force larger than the downward force of gravity. Thus even in the case where an object to be soldered has a large surface area and the leads 107 and the lands 105 have large thermal capacities, bridge phenomena and icicle phenomena can be prevented as compared with the absence of the solder drawing member 402.

The following will specifically describe the solder drawing member 402 and the notch 303A of the jet nozzle 303.

In the case where the notch 303A of the jet nozzle 303 is rectangular when viewed along the X axis, a uniform flow of molten solder can be obtained by entirely or partially notching one or two sides of the jet nozzle 303. In the case where the length of the notch exceeds a half of the circumference of the opening of the jet nozzle 303, the flow of the molten solder 101 becomes unstable. Moreover, an extremely short notch causes an unstable flow of the molten solder 101. In the first embodiment, as shown in FIG. 3(*d*), the cross section of the jet nozzle 303 has a length Lx of 5 mm along the X axis and a length Ly of 18 mm along the Y axis. Thus a notch length Lc has to be at least 3 mm for a stable flow of the molten solder 101. The notch length Lc is suitably set according to the cross-sectional area of the jet nozzle.

In the jet nozzle 303 of the first embodiment, the notch 303A with a notch height H lowered from the face of the nozzle by 0.5 mm can obtain a uniform flow of the molten solder 101. The notch height H has a desirable value varying with the height of the jetted molten solder from the jet nozzle and the notch height H is desirably set at 0.3 mm to 0.7 mm. In contrast to the first embodiment, in a typical jet nozzle, a notch having an extremely large depth in the height direction may prevent the molten solder 101 from reaching the printed wiring board 104. Thus the notch height H of the jet nozzle 303 has to be 5 mm or less.

In the first embodiment, as shown in FIG. 3(*d*), the opening 601 of the jet nozzle 303 has a rectangular shape with rounded corners and the rectangular notch 303A is formed only on one long side of the opening 601 so as to be lowered by 0.5 mm in the height direction. The opening 601 of the jet nozzle 303 having a rectangular shape with rounded corners in FIG. 3(*d*) may be circular or rectangular. Unfortunately, in the case of a circular opening, molten solder is jetted from a small jet area and results in low efficiency. In the case of a rectangular opening, a flow of molten solder from the corners may be suppressed. For this reason, in the first embodiment, the opening 601 has a rectangular shape with rounded corners as shown in FIG. 3(*d*). The opening 601 may be circular or rectangular if the opening 601 is designed in consideration of molten solder is jetted from a small jet area.

The effect of the layout of the solder drawing member 402 was examined by a specific experiment. The experiment will be described below.

In the first embodiment, typical solder for soldering was used that is molten lead-free solder of Sn-3.0% Ag-0.5% Cu at 260° C. The experiment was conducted using the solder in an atmosphere of nitrogen gas having a purity of at least 99.9%. Specifically, the molten solder was applied to various metal plates inclined about 30° with respect to the direction of gravity. In this test method, the wettability of a metal plate was evaluated depending upon whether or not the molten solder had flowed along the surface of the metal plate. The inventors assume that the molten solder does not flow along the surface of the metal plate due to the influence of a surface tension of the molten solder. Thus molten solder having an extremely different surface tension may have a different result. Furthermore, the molten solder had been applied onto a metal plate for a long time to confirm a wearing state on the surface of the metal plate, and then the wearing state was evaluated.

Consequently, it was confirmed that in the case of metal plates of nickel, copper, pure iron (a purity of 99.9%), and SPCC (iron components of at least 99%), the molten solder flows along the surfaces of the metal plates in the initial flowing state and the initial state is maintained. Moreover, it was confirmed that in the case of metal plates of titanium, SUS304, and SUS316, the molten solder does not flow along the surfaces of the metal plates in the initial flowing state. In other words, it was found that nickel, copper, pure iron (an impurity of 99.9%), and SPCC (iron components of at least 99%) are desirable to use for the solder drawing member 402 in view of a stable flow of molten solder.

In view of wear, a 0.3 mm metal plate of nickel and copper melted in five minutes, whereas a metal plate of pure iron and SPCC had not melted for one hour. In other words, pure iron and SPCC were found to be desirable in view of wear of the solder drawing member 402.

In the first embodiment, SPCC was used as a material of the solder drawing member 402 because of its availability. In the case where the solder drawing member 402 is composed of SPCC, wettability is hardly obtained in an initial state. Thus in the first embodiment, the SPCC solder drawing member 402 is plated with solder to obtain wettability. The jet nozzle 303 is made of stainless steel (e.g., SUS316), stainless steel with a nitrided surface, or titanium.

The SPCC used in the first embodiment is a cold-rolled steel plate containing chemical components including carbon of 0.15% or less, manganese of 0.6% or less, phosphorus of 0.1% or less, sulfur of 0.05% or less, and iron of at least 99.1%. These chemical components conform to JIS.

Nickel and copper with high wettability can achieve the same effect for a short time. Unfortunately, the solder drawing member 402 with extremely high wettability may be melted into the molten solder 101 and the performance cannot be kept for a long period. For this reason, nickel and copper are not suitable for the solder drawing member 402 of the first embodiment.

The following will describe the effect of the inert gas 312 heated by the heating unit 311.

The inert gas 308 supplied from the outside is heated by the heater 310 of the heating unit 311 and turns to the inert gas 312. The heated inert gas 312 is discharged upward in the passage 304 surrounding the jet nozzle 303. The inert gas 312 discharged upward is gathered by a hood shoulder 403 of a hood 313A not only around the end of the jet nozzle 303 but also around a location to be joined on the printed wiring board 104. The inert gas 312 gathered around the location to be joined on the printed wiring board 104 achieves the function of heating the printed wiring board 104 before soldering.

The heater 310 at a heating temperature lower than the heating temperature of the solder tank 102 cannot prevent a temperature decrease. Thus the heating temperature of the heater 310 is set to at least the heating temperature of the solder tank 102. An extremely high heating temperature may cause considerable thermal damage on the printed wiring board 104. For this reason, the heating temperature of the heater 310 is desirably set higher than the heating temperature of the solder tank, that is, at 400° C. or lower. In the first embodiment, the heating temperature of the solder tank 102 is 260° C. and the heating temperature of the inert gas in the heater 310 is 300° C.

The heated inert gas 312 prevents oxidation and a temperature decrease at a location receiving an excessive volume of the molten solder 101 from the leads 107 and the lands 105, achieving the function of easily cutting solder without increasing the viscosity. Moreover, the heated inert gas 312 prevents oxidation on the solder drawing member 402 and the molten solder 101 on the solder drawing member 402, achieving the function of keeping a surface tension.

This configuration makes it possible to forcibly remove an excessive volume of the molten solder 101 from the leads 107 and the lands 105 by a force larger than the force of gravity drop and achieve the function of preventing oxidation and a temperature decrease at a location receiving an excessive volume of the molten solder 101 and facilitating cutting of solder without increasing the viscosity. In addition, it is possible to obtain the function of keeping the surface tension of the solder drawing member 402 and the function of suppressing bridge phenomena and icicle phenomena and keeping the effect.

In the case where oxides are generated on the surface of the solder drawing member 402 having been unused for a long period, the oxides on the surface of the solder drawing member 402 are removed using a flux for activating a location to be soldered on the printed wiring board 104, thereby recovering the wettability.

In the example of the foregoing explanation, the solder drawing member 402 is a flat plate as shown in FIG. 3(a). As shown in FIG. 3(b), a fin 504 provided on the surface of the solder drawing member 402 is also effective. The fin 504 increases a contact area with the molten solder and a large force of attraction is obtained by the surface tension, thereby improving the attraction for the molten solder. The fin 504 is desirably made of the same material as the solder drawing member 402 or a material having high wettability to the molten solder. Moreover, the fin 504 may be shaped like waves or chains to further increase the contact area with the molten solder, thereby more effectively drawing the solder.

Referring to FIG. 4, the following will describe a flow of soldering using the soldering apparatus of the first embodiment.

FIG. 4 is a simple illustration of the movements of the jet nozzle 303 on the printed wiring board 104 having the sequentially arranged lands 105. In the first embodiment, the printed wiring board 104 is transported to relatively move the jet nozzle 303. In FIG. 4, the jet nozzle 303 is illustrated as a moving nozzle to simplify the explanation. In FIG. 4, A-AA, B-BB, C-CC, and D-DD represent the tracks of the jet nozzle 303. As indicated by the tracks, the opening of the jet nozzle 303 has long sides perpendicularly to the moving directions.

(Second Embodiment)

Figure 5:
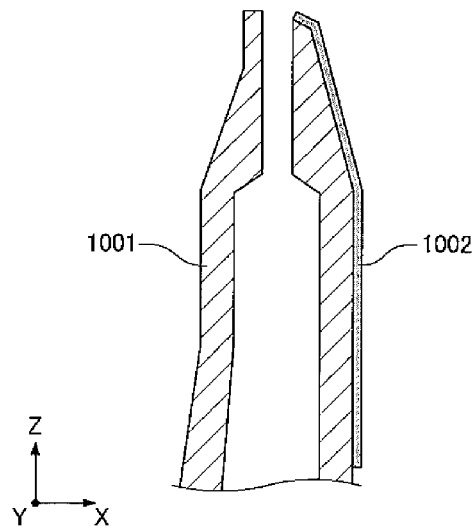
FIG. 5 is an enlarged view showing the end of the jet nozzle of a soldering apparatus according to a second embodiment of the present invention.

FIG. 5 shows the end of the nozzle of a soldering apparatus according to a second embodiment. The nozzle end is different from the end of the jet nozzle 303 of FIG. 3(c) in the soldering apparatus of FIGS. 1 to 3. Configurations other than the nozzle end are similar to those of the soldering apparatus of FIGS. 1 to 3 and the explanation thereof is omitted.

The nozzle of the second embodiment in FIG. 5 does not include the solder drawing member 402. Like the solder drawing member 402 of FIGS. 1 to 3, a jet nozzle 1001 is inclined on the right side of FIG. 5. Moreover, a copper coating 1002 is applied on the jet nozzle 1001. The copper coating 1002 is applied to the top vertical surface and inclined surface of the jet nozzle 1001.

The jet nozzle 1001 of the second embodiment is less replaceable in the case where the copper coating 1002 acting as a solder drawing part is worn. However, the inclined shape can be integrated with the nozzle and thus the inclined shape is stably located relative to the opening of the nozzle.

(Third Embodiment)

Figure 6:
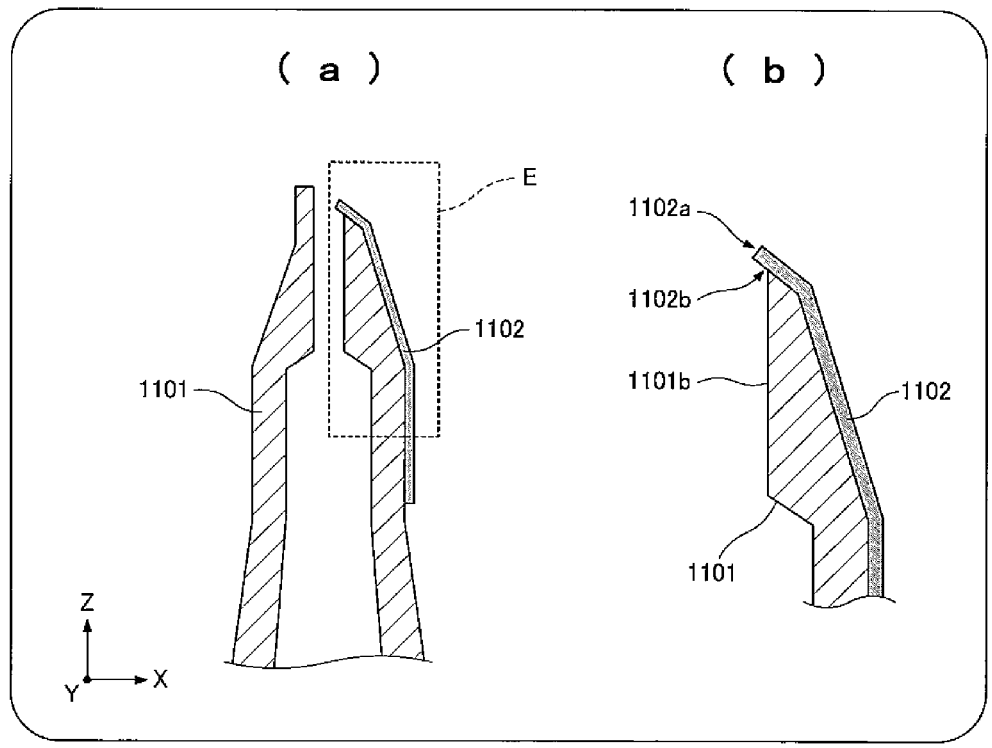
FIG. 6 is an enlarged view showing the end of the jet nozzle of a soldering apparatus according to a third embodiment of the present invention.

FIGS. 6(a) and 6(b) show the end of the nozzle of a soldering apparatus according to a third embodiment. The nozzle end is different from the end of the jet nozzle 303 of FIG. 3(c) in the soldering apparatus of FIGS. 1 to 3. Configurations other than the nozzle end are similar to those of the soldering apparatus of FIGS. 1 to 3 and the explanation thereof is omitted. FIG. 6(b) is an enlarged view of a region surrounded by a broken line E of FIG. 6(a).

On the nozzle of the third embodiment in FIGS. 6(a) and 6(b), a solder drawing member 1102 is used that is different from the solder drawing member 402. The solder drawing member 1102 has a flat end. Thus a jet nozzle 1101 has a hook mechanism (not shown) for fixing the solder drawing member 1102.

On the nozzle of the third embodiment, a surface 1102a of the solder drawing member 1102 is contaminated by molten solder. Thus the nozzle of the third embodiment requires surface treatment such as application of a coating material at least on the surface 1102a of the solder drawing member 1102.

Furthermore, on the nozzle of the third embodiment, the solder drawing member 1102 is projected from a nozzle wall surface 1101b and constitutes a member surface 1102b. The solder drawing member 1102 projected to the nozzle opening reduces the area of the nozzle opening, thereby preventing molten solder from flowing between the solder drawing member 1102 and the nozzle wall surface 1101b. Thus the soldering apparatus of the third embodiment can be obtained using the solder drawing member 1102 that can be more easily worked than the solder drawing member 402.

(Fourth Embodiment)

FIG. 7 shows the end of the nozzle of a soldering apparatus according to a fourth embodiment. The nozzle end is different from the end of the jet nozzle 303 of FIG. 3(c) in the soldering apparatus of FIGS. 1 to 3. Configurations other than the nozzle end are similar to those of the soldering apparatus of FIGS. 1 to 3 and the explanation thereof is omitted.

On the nozzle of the fourth embodiment in FIG. 7, a jet nozzle 1201 includes a recessed portion 1203 for fixing a solder drawing member 1202. The recessed portion 1203 on the jet nozzle 1201 can stably fix the solder drawing member 1202 and allow the wall surface of the jet nozzle 1201 and the solder drawing member 1202 to be flush with each other, thereby stabilizing a flow of molten solder.

In the structure of the fourth embodiment, however, the jet nozzle 1201 and the solder drawing member 1202 have complicated shapes with lower workability.

(Fifth Embodiment)

FIG. 8 shows the end of the nozzle of a soldering apparatus according to a fifth embodiment. The nozzle end is different from the end of the jet nozzle 303 of FIG. 3(c) in the soldering apparatus of FIGS. 1 to 3. Configurations other than the nozzle end are similar to those of the soldering apparatus of FIGS. 1 to 3 and the explanation thereof is omitted.

The nozzle of the fifth embodiment in FIG. 8 includes, instead of the solder drawing member 402, a solder drawing member 1302 inclined in two steps at angles θ2 and θ3. As shown in FIG. 8, the angle θ3 at the base of the nozzle is smaller than the angle θ2 at the end of the nozzle (θ2>θ3), thereby stabilizing a flow of molten solder on the solder drawing member 1302.

(Sixth Embodiment)

Referring to FIGS. 9A to 11B, the following will describe a soldering apparatus according to a sixth embodiment of the present invention.

The soldering apparatus of the sixth embodiment is suitable for local soldering in which an opening 601 of a jet nozzle 303 is smaller than shorter one of the length and width of a printed wiring board 104 to be soldered. The soldering apparatus of the sixth embodiment is different from the first embodiment as follows:

A solder tank 102 is controlled movably along the X axis, the Y axis, and the Z axis.

A jet nozzle 303 is controlled rotatably about the axis.

An outlet opening is narrow between the inner periphery of a hood 313B and the outer periphery of the jet nozzle 303.

The printed wiring board 104 transported to a soldering position is stopped, for example, until the completion of soldering on the surface of the printed wiring board 104.

Figure 9A:
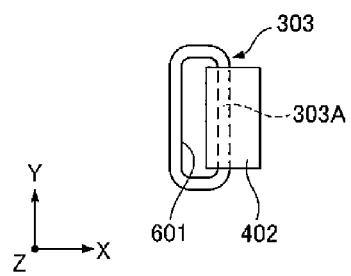
FIG. 9A is a plan view showing the jet nozzle of a soldering apparatus according to a sixth embodiment of the present invention.
Figure 9B:
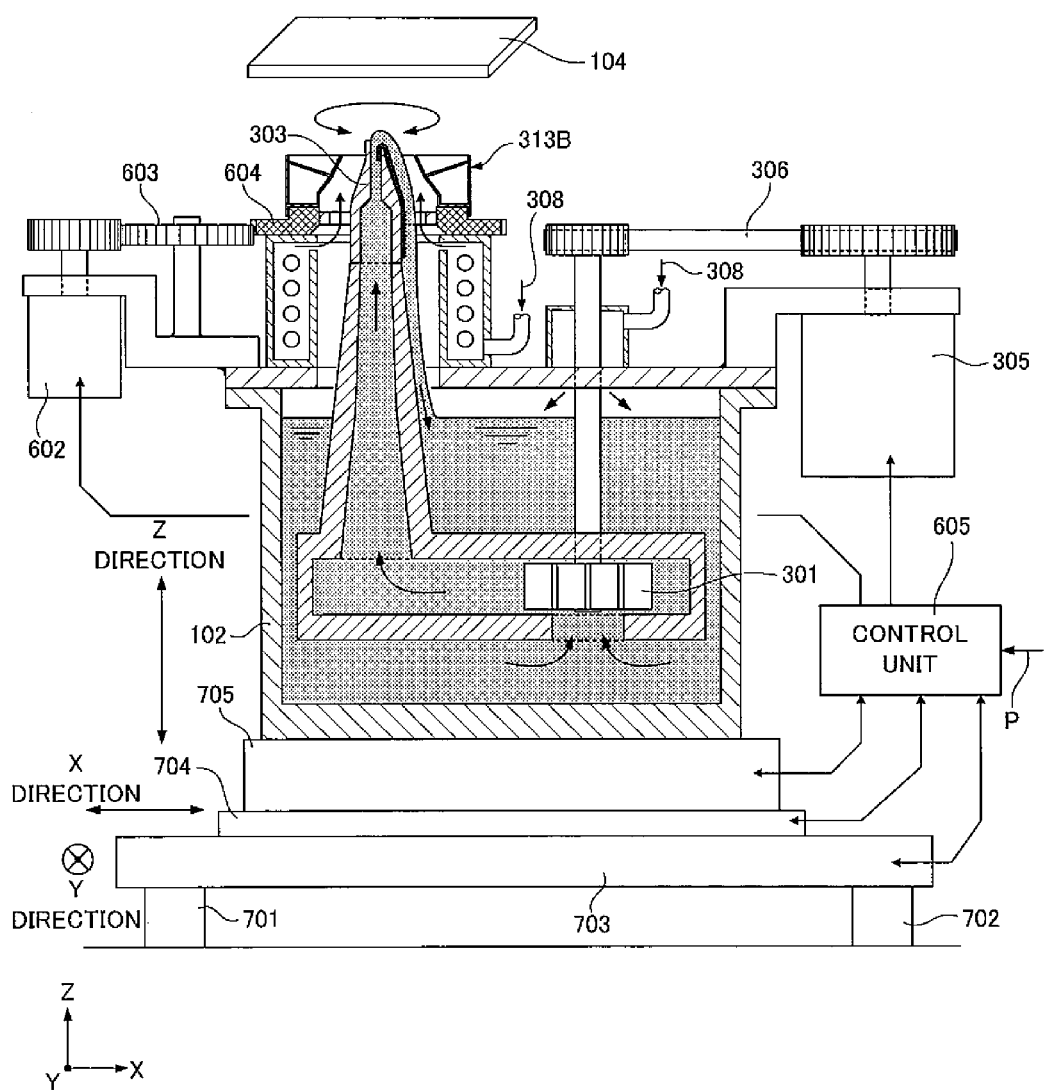
FIG. 9B is a cross-sectional view showing the soldering apparatus according to the sixth embodiment.

The solder tank 102 is mounted as follows:

As shown in FIG. 9B, the soldering apparatus of the sixth embodiment includes: rails 701 and 702 that are spaced in parallel; a Y table 703; an X table 704 placed on the Y table 703; and a Z table 705 placed on the X table 704. The Y table 703 is provided across the rails 701 and 702 and is driven in the longitudinal direction (Y direction) of the rails 701 and 702. The X table 704 is driven in a direction (X direction) crossing the longitudinal direction (Y direction) of the rails 701 and 702. The Z table 705 is driven in the vertical direction (Z direction). The solder tank 102 is mounted on the Z table 705. The Y table 703, the X table 704, and the Z table 705 are moving units that move the solder tank 102 in a horizontal plane and move the solder tank 102 in the vertical direction to change a distance between the solder tank 102 and an object to be soldered. The Y table 703, the X table 704, and the Z table 705 are operated to transport the jet nozzle 303 to any position of the printed wiring board 104, so that the jet nozzle 303 can be positioned thereon. In FIG. 9B, only the printed wiring board 104 is illustrated as a perspective view.

The jet nozzle 303 of the sixth embodiment is coaxial with a supply duct 302 and is rotatably connected to the supply duct 302. The outer periphery of a connecting part 706 formed on the jet nozzle 303 is connected to a rotary base 604. The rotary base 604 is coaxial with the jet nozzle 303 and is rotatably attached to a heating unit 311. The hood 313B is attached to the rotary base 604.

A rotary unit that rotates the jet nozzle 303 in the circumferential direction to position the jet nozzle 303 is configured as follows:

The rotary base 604 is connected to the output shaft of a rotary motor 602 via turning gears 603a and 603b. The rotary motor 602 is operated to set the rotation angle of the jet nozzle 303 at any angle around the axis of the supply duct 302. The hood 313B is attached to the rotary base 604.

The jet nozzle 303 is made of a softer material (lower stiffness) than the supply duct 302 because the jet nozzle 303 and the supply duct 302 in the configuration of the sixth embodiment are rubbed against each other by the rotating mechanism of the rotary base 604.

The operations of the Y table 703, the X table 704, the Z table 705, the rotary motor 602, and a propeller driving motor 305 are controlled by a control unit 605. Referring to a soldering plan P in which an operation process is registered, the control unit 605 controls the movement and positioning of the jet nozzle 303 to a proper position and the number of propeller revolutions in response to an object to be soldered. Thus joints having differently oriented leads 107 can be soldered while reducing bridge phenomena and icicle phenomena.

A part of the configuration of the control unit 605 will be more specifically described below.

Although a solder drawing member 402 is attached to the jet nozzle 303, a simple flow of excessive molten solder as in the first embodiment may not be fully attracted in the case where an object to be soldered has an extremely large surface area relative to the surface area of molten solder 101 flowing on the surface of the solder drawing member 402. In this case, according to the soldering plan P, the control unit 605 reduces the flow rate of the molten solder 101 flowing from the jet nozzle 303 to reduce a flow rate on the surface of the solder drawing member 402, and applies a force of gravity of the molten solder 101 into the jet nozzle 303, thereby increasing a force of drawing excessive solder.

In FIG. 10(a), the leads 107 of an electronic component 106 are soldered halfway. At such soldering points, the control unit 605 moves the solder tank 102 with only the X table 704, only the Y table 703, or both of the X table 704 and the Y table 703 to move the jet nozzle 303 in an illustrated direction (arrow G); meanwhile, the leads 107 are soldered.

In FIG. 10(b), a lead terminal portion 801 of the lead 107 to be soldered has a large thermal capacity due to, for example, a ground pattern. Thus a simple lateral movement causes a bridge around the lead terminal portion 801. In this case, when a center position 802 of the jet nozzle 303 passes through the lead terminal portion 801, the control unit 605 reduces the number of revolutions of the propeller driving motor 305 such that the molten solder 101 passes only through a notch 303A of the jet nozzle 303. In this configuration, a distance is set at 1 mm between the passage of the center position 802 of the jet nozzle 303 through the lead terminal portion 801 and a change of the number of revolutions of the propeller driving motor 305. A distance until a change of the number of revolutions of the propeller driving motor 305 is set according to the length of the lead 107 to be soldered and the minor axis length of the opening 601 of the jet nozzle 303. A desirable distance for changing the number of revolutions of the propeller driving motor 305 is at least 0 mm (when the center position 802 of the jet nozzle 303 reaches the lead terminal portion 801). In the case where the opening 601 of the jet nozzle 303 has a minor axis length of 5 mm, a distance for changing the number of revolutions of the propeller driving motor 305 is desirably set at 5 mm or less where the molten solder 101 is left on the leads 107.

With this operation, excessive molten solder at a point to be soldered is attracted downward by gravity and a surface tension inside and outside the jet nozzle 303, thereby suppressing bridge phenomena with higher reliability.

In the case where the ground pattern is provided at some point of the lead 107 instead of the terminal end of the lead 107 of the electronic component 106 to be soldered, a flow rate is reduced at some point of the lead and the control unit 605 controls operations so as to peel off excessive solder as will be described below, so that bridge phenomena can be effectively reduced.

Figure 11A:
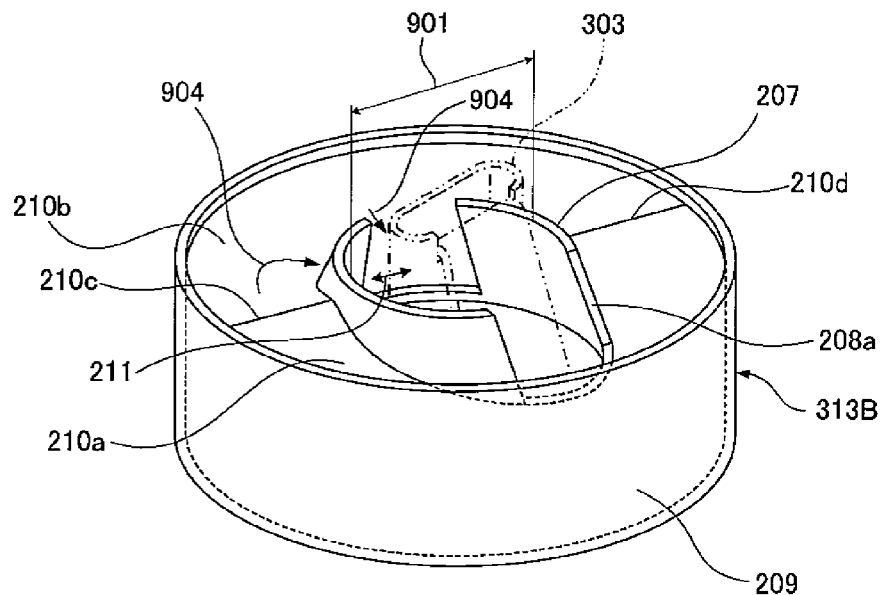
FIG. 11A is a perspective view showing a hood according to the sixth embodiment.
Figure 11B:
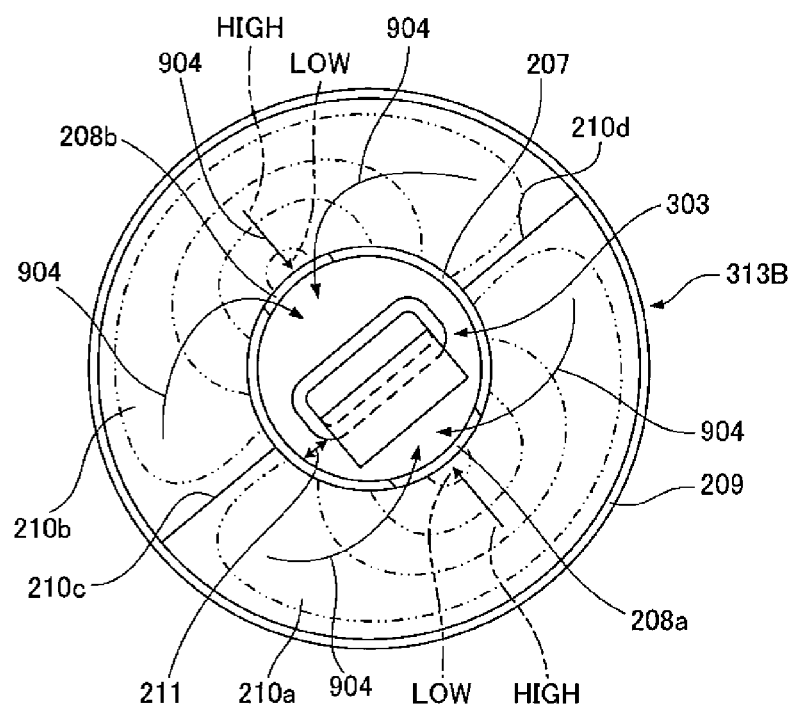
FIG. 11B is a plan view showing a hood according to the sixth embodiment.
Figure 13:
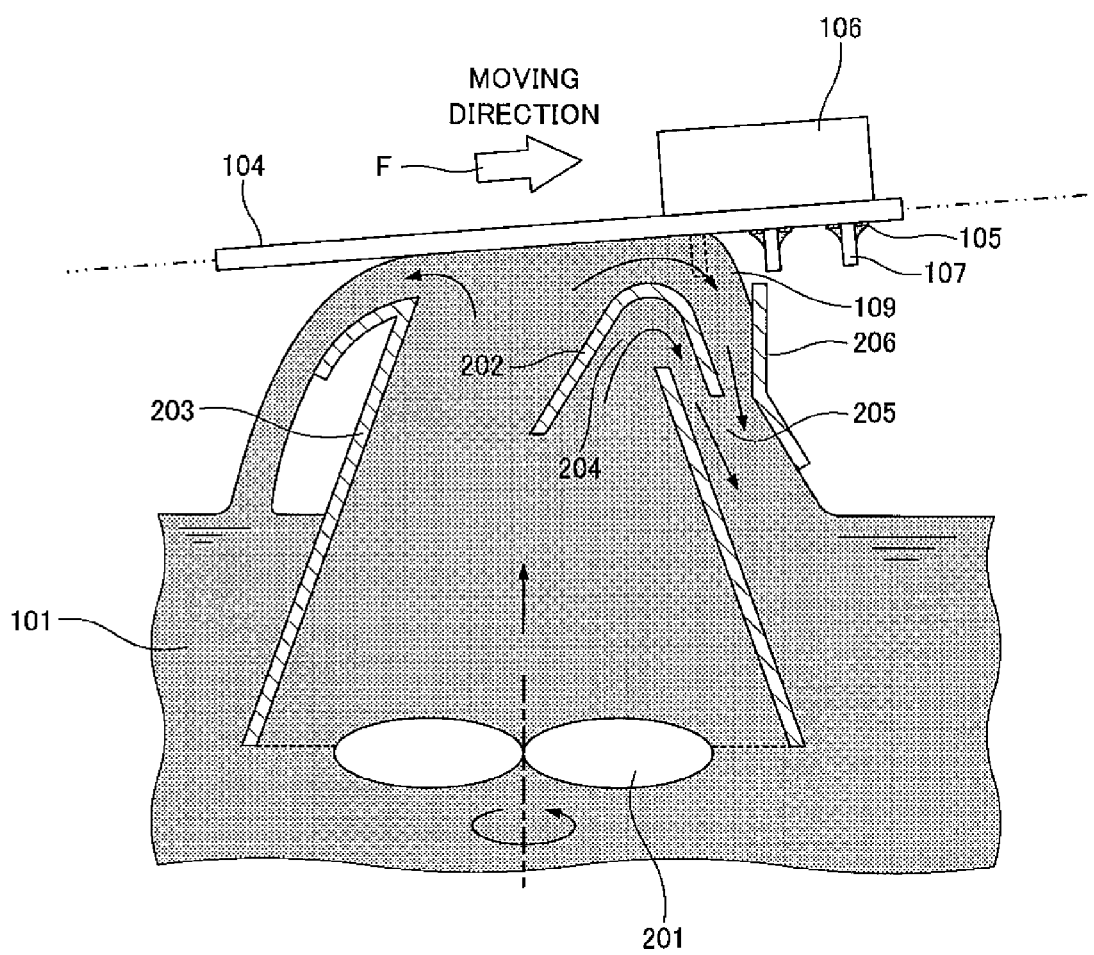
FIG. 13 shows a soldering apparatus described in Patent Literature 2.

Lateral movement at a soldering speed
A decrease in flow rate after passage through the position of a target ground pattern
High-speed movement at the same height Z as the subsequent jet position
Start jet at the subsequent jet position
Lateral movement at the soldering speed
A decrease in flow rate at the final position FIG. 11A is a perspective view of the hood 313B. FIG. 11B is a plan view of the hood 313B.

In the case where heated inert gas 312 is supplied around the jet nozzle 303, a hood opening 901 formed between the outer periphery of the jet nozzle 303 and a hood inner cylinder 207 around the outer periphery of the jet nozzle 303 can suppress a decrease in the concentration of the inert gas 312 around the end of the jet nozzle 303. The smaller the hood opening 901, the lower the concentration of the inert gas 312. In the case where the hood opening 901 is too small, the molten solder 101 jetted from the jet nozzle 303 spills out of the hood inner cylinder 207.

In order to return the molten solder 101 having spilled out of the hood inner cylinder 207 to the solder tank 102, the hood inner cylinder 207 is partially cut to form return flow ports 208a and 208b. Moreover, between the hood inner cylinder 207 and a hood outer cylinder 209 of the hood 313B, a first slope 210a is formed that is inclined toward the return flow port 208a and a second slope 210b is formed that is inclined toward the return flow port 208b. In FIG. 11B, contour lines are indicated by virtual lines to illustrate the inclinations of the surfaces of the first and second slopes 210a and 210b. The first and second slopes 210a and 210b are inclined from the outer periphery to the inner periphery except for connected points 210c and 210d with the first and second slopes 210a and 210b, and the lowest areas are located around the return flow ports 208a and 208b.

With this configuration, the hood opening 901 is reduced in size to suppress a decrease in the concentration of the inert gas 312 around the end of the jet nozzle 303. In this case, even if the molten solder 101 from the jet nozzle 303 spills out of the hood inner cylinder 207, the spilled solder can be reliably received by the first and second slopes 210a and 210b, fed downward to the return flow ports 208a and 208b as indicated by arrows 904, and collected to the solder tank 102.

The major axis length and minor axis length of the opening 601 of the jet nozzle 303 are optionally determined according to the soldered points and shapes of the printed wiring board 104 to be soldered. In the case where the opening 601 has an opening area of 4 mm$^2$ or less and a minor axis length of 2 mm or less, the molten solder 101 hardly flows. In the case where the opening 601 is too long in the major axis direction, the function of local soldering cannot be obtained. Thus the major axis length is desirably set at 25 mm or less. The shape, major axis length, and minor axis length of the opening within this range are not particularly limited. The notch 303A of the jet nozzle 303 is desirably shaped and sized as described in the first embodiment. In the present embodiment, the jet nozzle 303 is rectangularly notched with a major axis length of 18 mm and a depth of 0.5 mm and the solder drawing member 402 is attached to the notch 303A.

The hood 313B is locked to the rotary base 604 with a pin 905 and rotates in response to a rotation of the jet nozzle 303, so that the positions of the notch 303A of the jet nozzle 303 and the hood opening 901 are fixed regardless of the rotational position of the jet nozzle 303.

To be specific, the hood opening 901 of hood 313B has a diameter of 25 mm and a minimum clearance 211 between the hood inner cylinder 207 and the jet nozzle 303 is set at 2.5 mm. An extremely small clearance increases the molten solder 101 spilling out of the hood 313B and prevents the inert gas 312 from reaching the end of the jet nozzle 303. Thus the minimum clearance 211 between the hood inner cylinder 207 and the jet nozzle 303 is desirably set to at least 1 mm. In order to prevent a decrease in the concentration of the inert gas 312 between the jet nozzle 303 and the printed wiring board 104, the minimum clearance between the hood inner cylinder 207 and the jet nozzle 303 is desirably set at 4 mm or less.

The return flow ports 208a and 208b formed on the hood inner cylinder 207 have to be at least 8 mm in width to smoothly pass the molten solder 101. In the case where the widths of the return flow ports 208a and 208b are as long as or longer than the major axis length of the opening 601 of the jet nozzle 303, a decrease in the concentration of the inert gas cannot be prevented. Thus as shown in FIG. 11B, the return flow port 208b has a width of 10 mm at the rear where the notch 303A of the jet nozzle 303 is not provided and the return flow port 208a has a width of 16 mm at the front where the notch 303A of the jet nozzle 303 is provided. The width of the return flow port 208a is smaller than 18 mm, which is the major axis length of the opening 601.

The control unit 605 properly controls the position and orientation of the jet nozzle 303 that provides a one direction flow and includes the notch 303A only on one side. Thus on the printed wiring board 104 to be partially soldered or the printed wiring board 104 including an electronic component having rows of differently oriented leads, an excessive volume of the molten solder 101 from the leads 107 and lands 105 is forcibly removed by a force larger than a force of gravity. In addition, it is possible to achieve the function of preventing oxidation and a temperature decrease at a point fed with an excessive volume of the molten solder 101 and facilitating cutting of solder without increasing the viscosity, the function of keeping the surface tension of the solder drawing member 402, and the function of suppressing bridge phenomena and icicle phenomena and keeping the effect of suppression.

In the sixth embodiment, the soldering apparatus includes: the moving units that move the solder tank 102 in the horizontal plane (X-Y direction) and move the solder tank 102 in the vertical direction (Z direction) to change a distance from an object to be soldered; and the rotary unit that rotates the jet nozzle 303 in the circumferential direction to position the jet nozzle 303. According to the soldering plan P, the control unit 605 may control the operations of the moving units that move the solder tank 102 in the horizontal plane (X-Y direction) and move the solder tank 102 in the vertical direction (Z direction) to change a distance from an object to be soldered or the operations of the rotary unit that rotates the jet nozzle 303 in the circumferential direction to position the jet nozzle 303, thereby effectively achieving higher soldering quality than in the related art.

In the sixth embodiment, the printed wiring board 104 at the soldering position is stopped until the completion of soldering on the surface of the printed wiring board 104. The printed wiring board 104 does not always have to be stopped. The printed wiring board 104 may be continuously transported at a constant speed or intermittently stopped and transported.

INDUSTRIAL APPLICABILITY

The present invention can contribute to mass production of various kinds of electronic equipment.

The invention claimed is:

1. A soldering apparatus comprising:
   a solder tank storing molten solder;
   a jet nozzle including an outer wall and an opening with a notch, the jet nozzle jetting the molten solder supplied from inside of the solder tank; and
   a solder drawing member located at the notch and extending from an inner surface of the outer wall to an outer surface of the outer wall,
   wherein the solder drawing member has a surface made of a material having higher wettability than a surface of the jet nozzle, and
   wherein a height of the notch is in a range from 0.3 to 0.7mm in a jetting direction of the jet nozzle.

2. The soldering apparatus according to claim 1, wherein the solder drawing member is detachably attached to an outer surface of the jet nozzle.

3. The soldering apparatus according to claim 1, wherein the jet nozzle is made of one of stainless steel, stainless steel with a nitrided surface, and titanium, and
   the solder drawing member is made of an iron material having a purity of at least 99%.

4. The soldering apparatus according to claim 3, wherein the iron material of the solder drawing member has a surface plated with solder.

5. The soldering apparatus according to claim 1, wherein the notch is provided at a rear in a relative moving direction of the jet nozzle.

6. The soldering apparatus according to claim 1, wherein the surface of the attached solder drawing member has an inclination angle of at least 15° with respect to a jetting direction of the jet nozzle.

7. The soldering apparatus according to claim 1, wherein the solder drawing member is composed of a plate, and the solder drawing member has one end projecting into the opening of the jet nozzle from the notch.

8. The soldering apparatus according to claim 1, comprising a rotary unit that rotates the jet nozzle in a circumferential direction to position the jet nozzle.

9. The soldering apparatus according to claim 1, comprising a hood that guides inert gas discharged from a vicinity of the jet nozzle to an object to be soldered.

10. The soldering apparatus according to claim 9, wherein the hood comprises: a hood inner cylinder surrounding the jet nozzle with a clearance disposed between the hood inner cylinder and an outer periphery of the jet nozzle, the clearance allowing passage of the inert gas;
    a hood outer cylinder surrounding an outer periphery of the hood inner cylinder; and
    a return flow port that allows passage of the molten solder returning to the solder tank, provided on the hood inner cylinder.

11. The soldering apparatus according to claim 10, wherein the hood comprises a slope that is formed between the hood inner cylinder and the hood outer cylinder to catch the molten solder spilling out of the hood inner cylinder and guide the molten solder to the return flow port.

* * * * *